(12) United States Patent
Seo et al.

(10) Patent No.: US 7,751,202 B2
(45) Date of Patent: Jul. 6, 2010

(54) MULTI-LAYERED PRINTED CIRCUIT BOARD HAVING INTEGRATED CIRCUIT EMBEDDED THEREIN

(75) Inventors: Ho-Seong Seo, Suwon-si (KR); Young-Min Lee, Yongin-si (KR); Youn-Ho Choi, Suwon-si (KR)

(73) Assignee: Samsung Electronics Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 469 days.

(21) Appl. No.: 11/685,269

(22) Filed: Mar. 13, 2007

(65) Prior Publication Data

US 2008/0062657 A1 Mar. 13, 2008

(30) Foreign Application Priority Data

Sep. 7, 2006 (KR) .................. 10-2006-0086215

(51) Int. Cl.
*H05K 1/11* (2006.01)
(52) U.S. Cl. ...................... 361/795; 174/258
(58) Field of Classification Search .............. 174/258, 174/259, 260; 361/763, 748, 795; 257/737, 257/499, 690, 706
See application file for complete search history.

(56) References Cited

U.S. PATENT DOCUMENTS 6,903,458 B1 6/2005 Nathan ............... 257/737
7,312,102 B2* 12/2007 Hung ................ 438/106
7,391,103 B2* 6/2008 Fuergut et al. ........... 257/678
2003/0045083 A1* 3/2003 Towle et al. ............. 438/612
2005/0100719 A1* 5/2005 Kanakarajan et al. ..... 174/259
2009/0042336 A1* 2/2009 Paik et al. ............... 438/107

FOREIGN PATENT DOCUMENTS

| KR | 1998-71398 | 10/1998 |
| KR | 2006-51422 | 5/2006 |
| KR | 2006-61374 | 6/2006 |

* cited by examiner

*Primary Examiner*—Jeremy C Norris
*Assistant Examiner*—Yuriy Semenenko
(74) *Attorney, Agent, or Firm*—Cha & Reiter, LLC

(57) ABSTRACT

Disclosed is a multi-layered printed circuit board including a plurality of insulation layers; a plurality of conductive patterns stacked on the multi-layered printed circuit board while alternating with the insulation layers; an integrated circuit positioned inside a core insulation layer of the insulation layers so as to be embedded in the multi-layered printed circuit board, a plurality of external connection terminal being positioned on a surface of the integrated circuit for external electric connection; and a film attached to a surface of the integrated circuit, the film having a plurality of inner conductive pads in one-to-one electric connection with the external connection terminals, the film being electrically connected to an adjacent conductive pattern layer.

8 Claims, 5 Drawing Sheets

MULTI-LAYERED PRINTED CIRCUIT BOARD HAVING INTEGRATED CIRCUIT EMBEDDED THEREIN

CLAIM OF PRIORITY

This application claims priority to an application entitled "Multi-layered Printed Circuit board Having Integrated Circuit Embedded Therein," filed with the Korean Intellectual Property Office on Sep. 7, 2006 and assigned Serial No. 2006-86215, the contents of which are incorporated herein by reference.

BACKGROUND OF THE INVENTION

1. Field of the Invention

The present invention relates to a multi-layered printed circuit board (hereinafter, referred to as multi-layered PCB), and more particularly to a multi-layered PCB having an integrated circuit (hereinafter, referred to as IC) embedded (i.e. incorporated) therein.

2. Description of the Related Art

PCBs are used for a wide range of electronic products. Particularly, multi-layered PCBs having a plurality of insulation layers and a plurality of conductive pattern layers stacked alternately are used for laptop computers, portable wireless terminals, and other electronic devices, which require a high level of integration.

FIG. 1 is a sectional view showing a conventional multi-layered PCB, and FIG. 2 is a top view of an IC shown in FIG. 1. The multi-layered PCB 100 has first to fifth insulation layers 111-115 and first to sixth conductive pattern layers 121-126 stacked alternately, as well as an IC 140 embedded therein. The IC 140 is positioned inside the third insulation layer 113, which corresponds to a core insulation layer of the first to fifth insulation layers 111-115. The IC 140 has a plurality of external connection terminals (i.e. bumps) 142 positioned on its surface for electric connection to the exterior.

As the external connection terminals 142 have very small pitch and size, and as the IC 140 needs to undergo a rewiring process, the process during which a plurality of conductive pads 144 are placed in the circuit region of the IC 140, the conductive pads 144 are in one-to-one electric connection with the external connection terminals 142, which are positioned on the periphery of the IC 140, via wires 146. The conductive pads 144, which are larger than the external connection terminals 142, facilitate the electric connection between the IC 140 and the adjacent fifth conductive pattern layer 125.

The multi-layered PCB 100 has a plurality of via-holes 130 for interlayer electric connection so that two adjacent conductive pattern layers are electrically connected to each other through the via-holes. The via holes 130 may be formed by, for example, laser etching.

The electric connection between the IC 140 and the fifth conductive pattern layer 125 is also made through the via-holes 130. Particularly, the fifth conductive pattern layer 125 is electrically connected to the conductive pads 144 through the via-holes 130 positioned between the fifth conductive pattern layer 125 and the IC 140.

However, the conventional multi-layered PCB 100 has several problems. In particular, the electric connection between the IC 140 and the fifth conductive pattern layer 125 requires rewiring of the IC 140, and a plurality of conductive pads 144 need to be placed in the circuit region of the IC 140 during the rewiring process. This degrades the RF characteristics of the IC 140, as a coupling phenomenon occurs between circuit devices formed in the circuit region (e.g. inductors, transistors) and the conductive pads 144 and wires 146.

SUMMARY OF THE INVENTION

Accordingly, the present invention has been made to solve the above-mentioned problems occurring in the prior art and provide additional advantages. In particular, the present invention provides a multi-layered PCB having an IC embedded therein to guarantee a high level of integration, without requiring a rewiring process and without degrading the RF characteristics.

In one aspect of the present invention, there is provided a multi-layered printed circuit board including a plurality of insulation layers; a plurality of conductive patterns stacked on the multi-layered printed circuit board alternatively with the insulation layers; an integrated circuit positioned inside a core insulation layer of the insulation layers so as to be embedded in the multi-layered printed circuit board; a plurality of external connection terminals being positioned on a surface of the integrated circuit for external electric connection; and a film attached to a surface of the integrated circuit, the film having a plurality of inner conductive pads that are in one-to-one electric connection with the external connection terminals, and the film being electrically connected to an adjacent conductive pattern layer.

BRIEF DESCRIPTION OF THE DRAWINGS

The above features and the advantages of the present invention will be apparent from the following detailed description taken in conjunction with the accompanying drawings, in which.

DETAILED DESCRIPTION OF THE PRESENT INVENTION

Hereinafter, several aspects of the present invention will be described with reference to the accompanying drawings. In the following descriptions, detailed descriptions of known functions and configurations are omitted, as the may make the subject matter of the present invention unclear.

Figure 1:
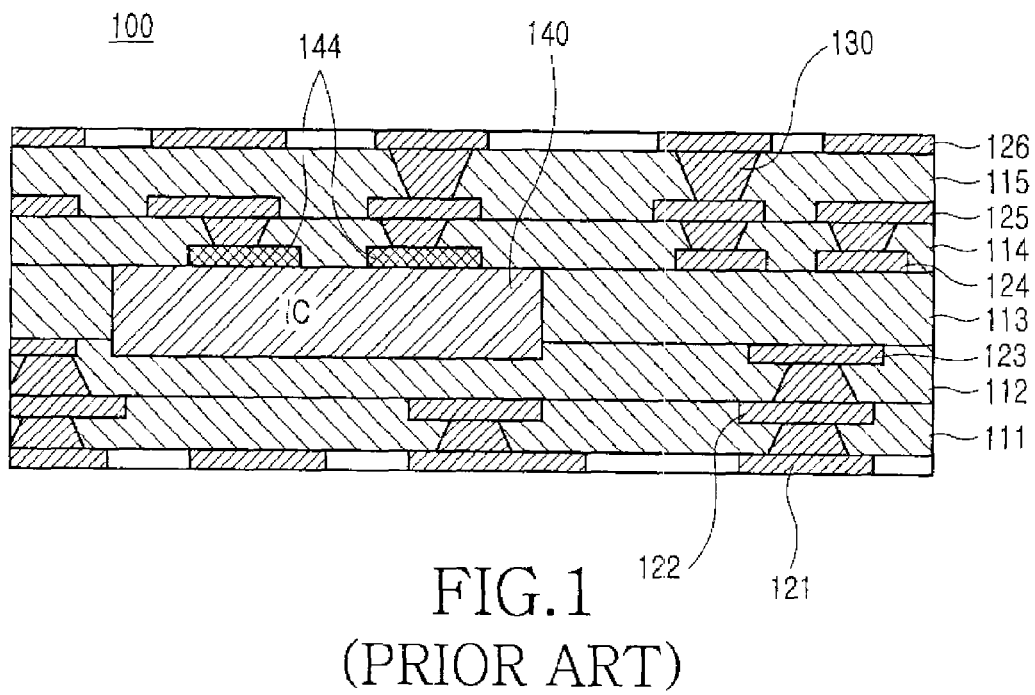
FIG. 1 is a sectional view showing a conventional multi-layered PCB.
Figure 2:
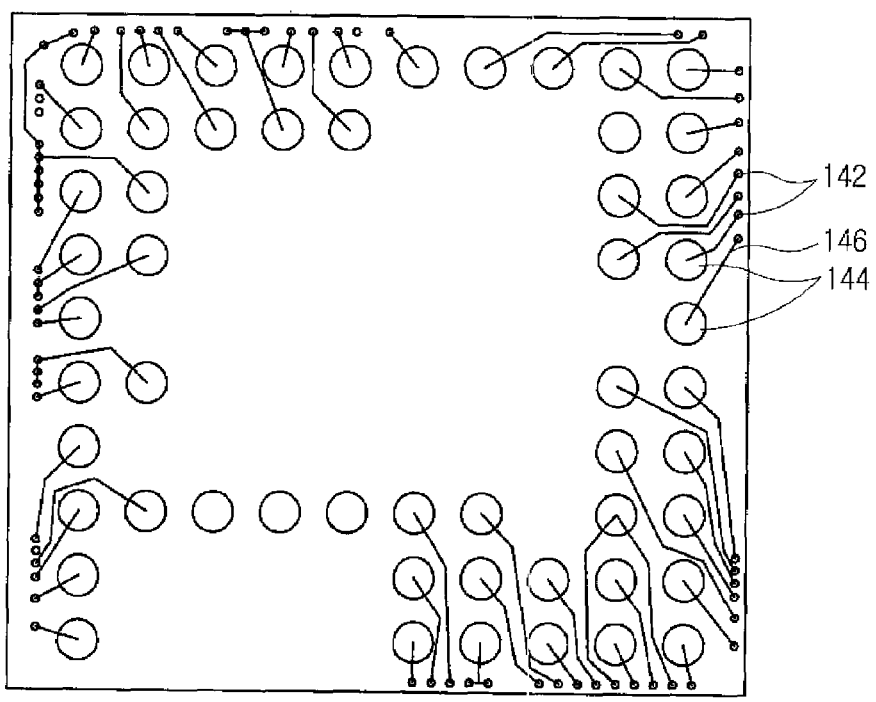
FIG. 2 is a top view of an IC shown in FIG. 1.
Figure 3:
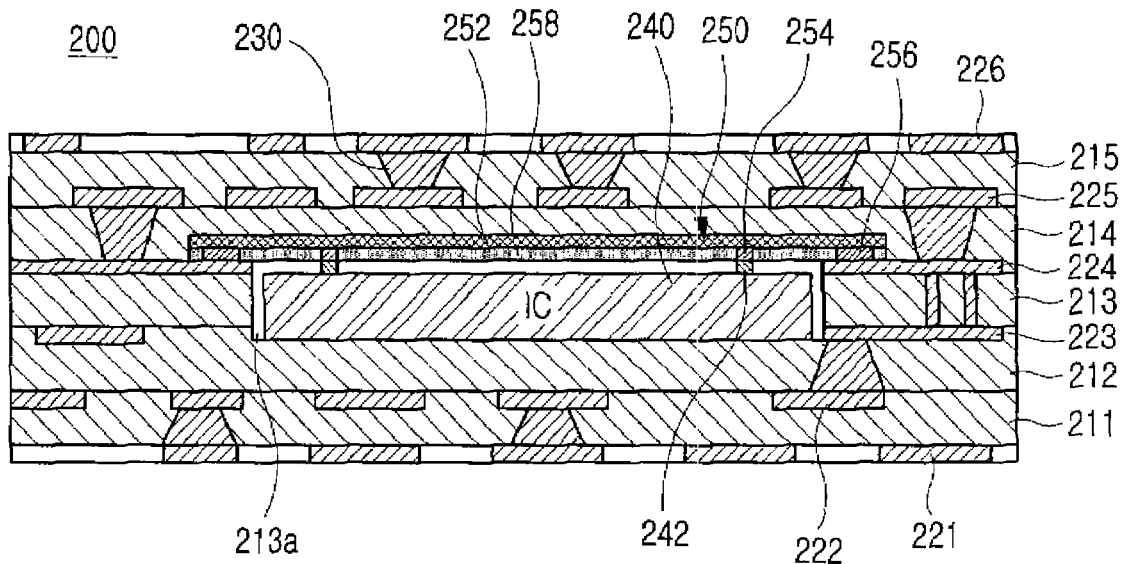
FIG. 3 is a sectional view showing a multi-layered PCB according to a first aspect of the present invention.
Figure 4:
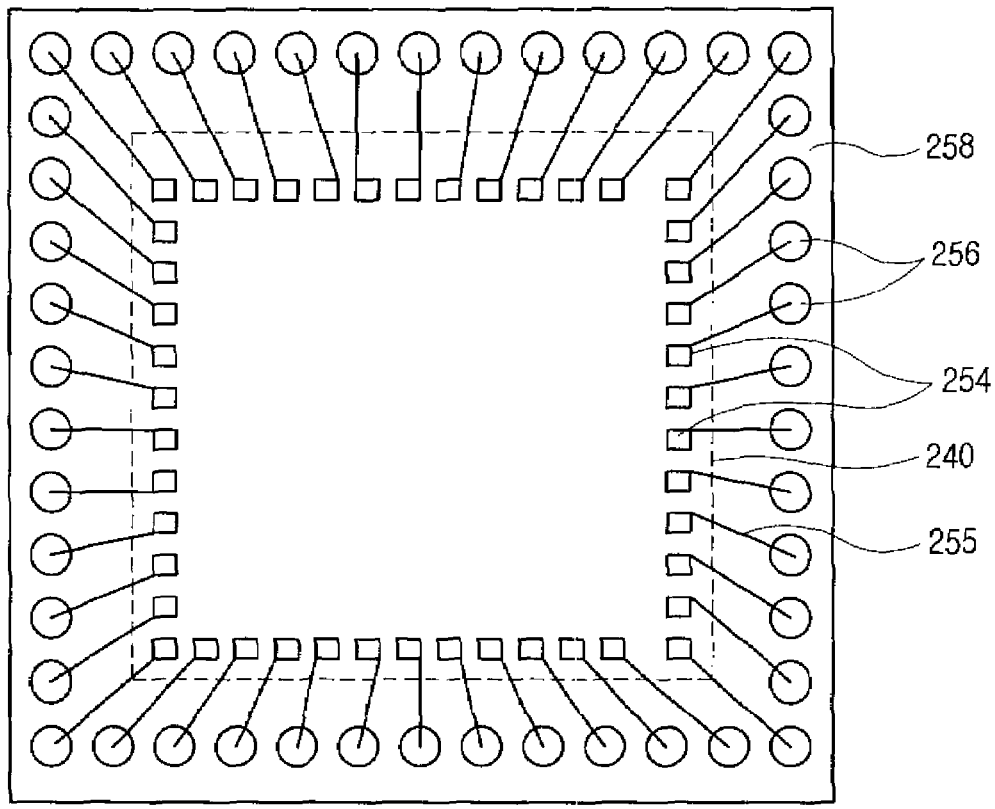
FIG. 4 is a bottom view of a film shown in FIG. 3.

FIG. 3 is a sectional view showing a multi-layered PCB according to a preferred embodiment of the present invention, and FIG. 4 is a bottom view of a film shown in FIG. 3.

The multi-layered PCB 200 includes first to fifth insulation layers 211-215 and a plurality of conductive pattern layers 221-226 stacked alternately, as well as an IC 240 and a film 250 embedded therein. The IC 240 is positioned inside the third insulation layer 213, which corresponds to a core insulation layer of the first to fifth insulation layers 211-215. The IC 240 has a plurality of external connection terminals 242 positioned on its upper surface for electrical connection to the exterior. The multi-layered PCB 200 has a plurality of via-holes 230 for interlayer electric connection so that two adjacent conductive pattern layers are electrically connected to each other through the via-holes 230. The via-holes 230 may be formed by, for example, laser etching.

The film 250 includes a substrate 252; conductive pad layers 254 and 256 stacked on the lower surface of the substrate 252; and a bonding layer 258 stacked on the lower surface of the substrate 252 so as to enclose the conductive pad layers 254 and 256. The conductive pad layers 254 and 256 of the film 250 include a plurality of inner conductive pads 254 positioned on the inner portion of the film 250 so as to correspond to the external connection terminals 242 on one to one basis; a plurality of outer conductive pads 256 arranged on the outer side of the film 250 so as to correspond to the inner conductive pads 254 on one to one basis; and a plurality of wires 255 connecting the inner conductive pads 254 to the outer conductive pads 256 on one to one basis.

The lower surface of the film 250 is bonded to the upper surface of the IC 240. The center of the film 250, including the inner conductive pads 254, is attached to the upper surface of the IC 240. The periphery of the film 250, including the outer conductive pads 256, is attached to the fourth conductive pattern layer 224. The inner conductive pads 254 are in one-to-one electric connection with the external connection terminals 242. To this end, the inner conductive pads 254 are arranged in the same manner as the external connection terminals 242. According to the present aspect of the present invention, the inner conductive pads 254, the external connection terminals 242, and the outer conductive pads 256 are arranged in a square configuration with a predetermined pitch.

The outer conductive pads 256 have a size larger than that of the inner conductive pads 254 so as to facilitate the electric connection between the film 250 and the fourth conductive pattern layer 224. As shown, the inner conductive pads 254 are electrically connected to the external connection terminals 242, and the outer conductive pads 256 are electrically connected to the fourth conductive pattern layer 224, which is stacked on the upper surface of the third insulation layer 213.

FIGS. 5 to 12 show a method for manufacturing a multi-layered PCB according to a preferred embodiment of the present invention. The method includes steps (a) to (h).

Figure 5:
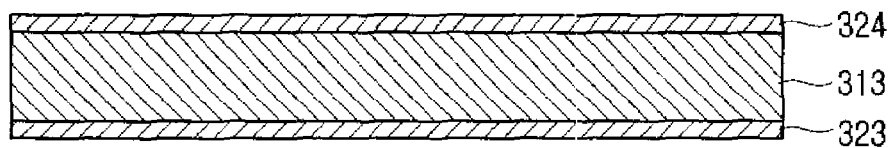
FIGS. 5 to 12 show a method for manufacturing a multi-layered PCB according to a second aspect of the present invention.

Referring to FIG. 5, a core insulation layer 313 is coated with conductive pattern layers 323 and 324 on the upper and lower surfaces. For example, a core insulation layer 313 is prepared preparing a Flame Resistant 4 (FR-4) that is coated with a copper foil on the upper and lower surfaces. Thereafter, a photolithography process is used to pattern the copper foil and to form conductive pattern layers 323 and 324. The photolithography process includes the steps of applying photoresist to the copper foil, exposing the photoresist to light using a mask so that a desired pattern is formed thereon, developing the exposed portion, and etching the copper foil using the remaining photoresist.

Figure 6:
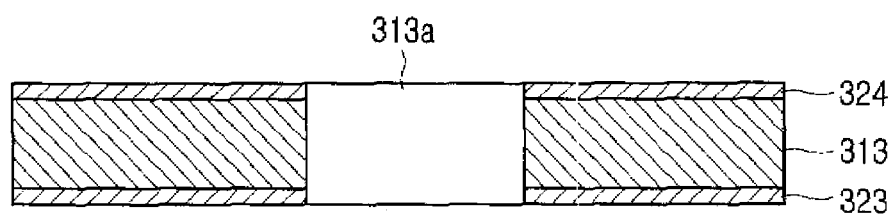

Referring to FIG. 6, a hole 313a is formed so as to extend through the core insulation layer 313, in order to secure a space for receiving an IC. A conventional drilling process may be employed to form the hole 313a. The planar shape of the hole 313a is identical to that of the IC (i.e. square), and the size of the hole 313a is larger than that of the IC.

Figure 7:
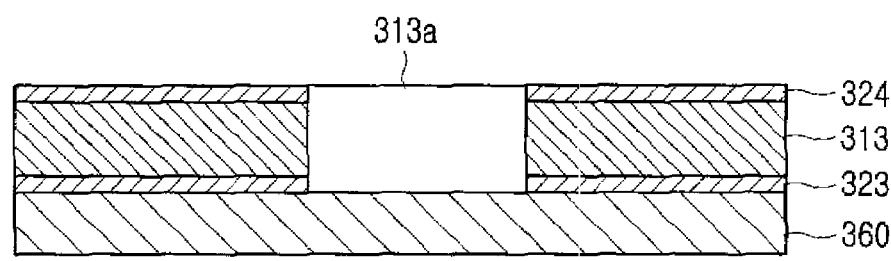

Referring to FIG. 7, tape 360 is attached to the lower end of the core insulation layer 313, which has been drilled, in order to support the IC. As a result, the lower end of the hole 313a is closed by the tape 360.

Figure 8:
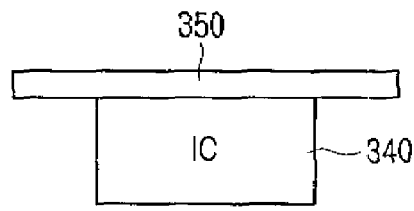

Referring to FIG. 8, a film 350 is attached to the upper surface of the IC 340. As a result, inner conductive pads of the film 350 are in one-to-one electric connection with external connection terminals of the IC 340. A conventional COF (chip on film) may be used as the film 350. When the COF is used, the inner conductive pads can be formed precisely with a pitch of at least 30 μm.

Figure 9:
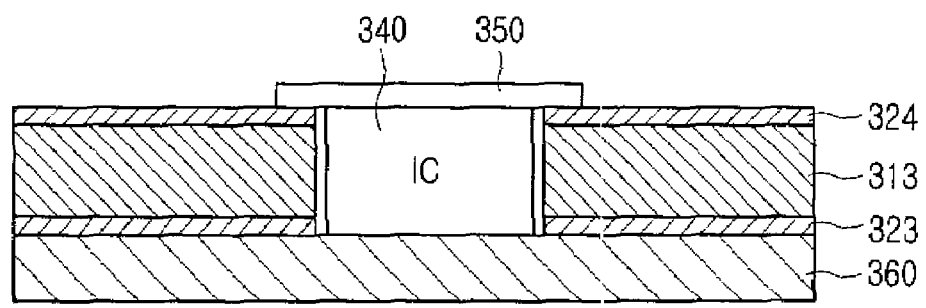

Referring to FIG. 9, the IC 340, to which the film 350 has been attached, is inserted into the hole 313a of the core insulation layer 313, to which the tape 360 has been attached. Particularly, the periphery of the film 350 is attached to the upper conductive pattern layer 324, and the outer conductive pads of the film 350 are electrically connected to the upper conductive pattern layer 324.

Figure 10:
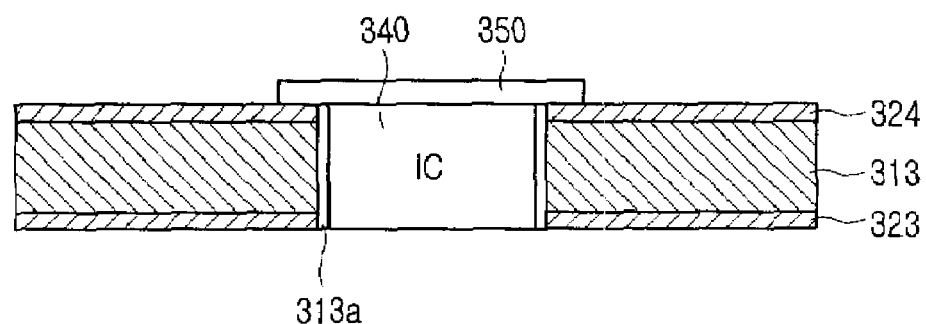

Referring to FIG. 10, the tape 360 is removed.

Figure 11:
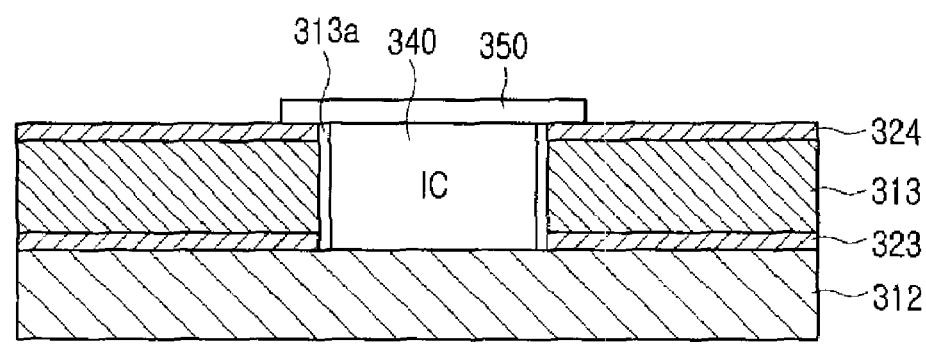
Figure 12:
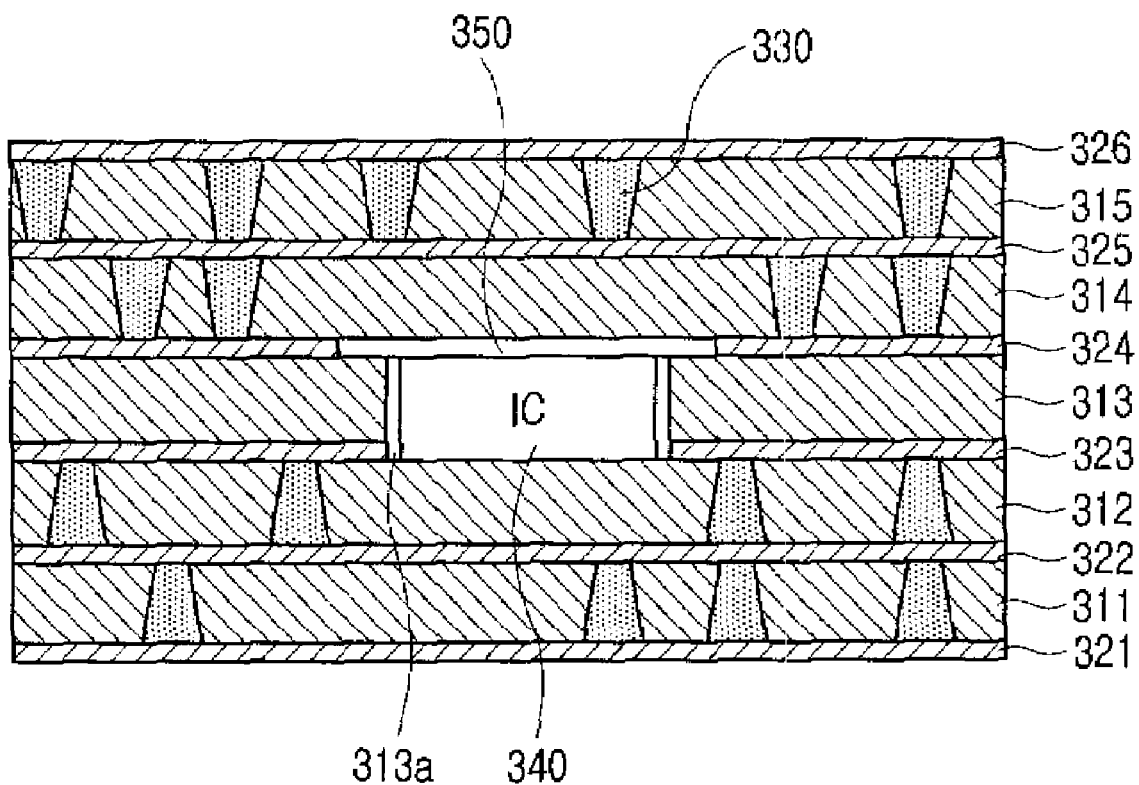

Referring to FIGS. 11 and 12, a plurality of insulation layers 311, 312, 313, and 315 and a plurality of pattern layers 321, 322, 325, and 326 are built up on the upper and lower sides of the core insulation layer 313, respectively. Apart from the core insulation layer 313, respective insulation layers 311, 312, 314, and 315 may be made of ABF (Ajinomoto build-up film). Each insulation layer 311, 312, 313, 314, and 315 may have via-holes 330 formed thereon for interlayer electric connection by laser etching. The core insulation layer 313 contains via-holes as shown in FIG. 3.

One advantage of the multi-layered PCB having an IC embedded therein, according to the present invention, is that high level of integration can be guaranteed without requiring a rewiring process and without degrading the RF characteristics, as a film is used to electrically connect the IC to conductive pattern layers.

While the invention has been shown and described with reference to certain preferred embodiments thereof it will be understood by those skilled in the art that various changes in form and details may be made therein without departing from the spirit and scope of the invention as defined by the appended claims.

What is claimed is:

1. A multi-layered printed circuit board comprising:
    a plurality of insulation layers;
    a plurality of conductive patterns alternatively stacked with the insulation layers, on the multi-layered printed circuit board;
    an integrated circuit disposed inside a core insulation layer of the insulation layers and embedded in the multi-layered printed circuit board;
    a plurality of external connection terminals being positioned on a upper surface of the integrated circuit and being configured for external electric connection; and
    a film disposed on the upper surface of the integrated circuit, the film having a plurality of inner conductive pads disposed on a lower surface of the film in direct one-to-one electric connection with the external connection terminals without via-holes and wires, and the film being electrically connected to an adjacent conductive pattern layer.

2. The multi-layered printed circuit board as claimed in claim 1, wherein the film further comprises a plurality of outer conductive pads disposed on the lower surface of the film in one-to-one electric connection with the inner conductive pads, the outer conductive pads also being directly connected to the adjacent conductive pattern layer without via-holes and wires.

3. The multi-layered printed circuit board as claimed in claim 2, wherein the film further comprises a substrate having a surface on which the inner and outer conductive pads of the film are directly stacked, and a bonding layer being directly stacked on the surface of the substrate and being configured to enclose the inner conductive pads and the outer conductive pads.

4. The multi-layered printed circuit board as claimed in claim 2, wherein a central portion of the film is attached to the surface of the integrated circuit, the central portion including the inner conductive pads, and wherein a periphery of the film is attached to a surface of the adjacent conductive pattern layer, the periphery including the outer conductive pads.

5. The multi-layered printed circuit board as claimed in claim 1, wherein the core insulation layer has a hole, and the integrated circuit is inserted into the hole with the film attached to the integrated circuit.

6. The multi-layered printed circuit board as claimed in claim 1, wherein the film is a chip-on-film.

7. The multi-layered printed circuit board as claimed in claim 1, wherein the core insulation layer is made of FR4, and remaining insulation layers are made of Ajinomoto build-up film.

8. The multi-layered printed circuit board as claimed in claim 1, further comprising:
a plurality of via holes contained in the insulation layers, each via hole being configured to electrically connect the conductive patterns separated by one of the insulation layers.

* * * * *